United States Patent
Malladi et al.

(10) Patent No.: US 12,248,402 B2
(45) Date of Patent: Mar. 11, 2025

(54) BANDWIDTH BOOSTED STACKED MEMORY

(71) Applicant: Samsung Electronics Co., Ltd., Suwon-si (KR)

(72) Inventors: Krishna T. Malladi, San Jose, CA (US); Mu-Tien Chang, Santa Clara, CA (US); Dimin Niu, Sunnyvale, CA (US); Hongzhong Zheng, Los Gatos, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 40 days.

(21) Appl. No.: 18/070,328

(22) Filed: Nov. 28, 2022

(65) Prior Publication Data
US 2023/0087747 A1 Mar. 23, 2023

Related U.S. Application Data

(60) Continuation of application No. 17/156,362, filed on Jan. 22, 2021, now Pat. No. 11,513,965, which is a (Continued)

(51) Int. Cl.
*G06F 12/0879* (2016.01)
*G11C 11/417* (2006.01)

(52) U.S. Cl.
CPC ........ *G06F 12/0879* (2013.01); *G11C 11/417* (2013.01); *G06F 2212/603* (2013.01)

(58) Field of Classification Search
CPC ........... G06F 12/0879; G06F 2212/603; G11C 11/417
See application file for complete search history.

(56) References Cited

U.S. PATENT DOCUMENTS 5,822,757 A * 10/1998 Chi ................. G06F 12/0848
711/119
8,140,874 B2 3/2012 Hayashi et al.
(Continued)

FOREIGN PATENT DOCUMENTS

JP    2000-29782 A    1/2000
JP    2009-71070 A    4/2009
(Continued)

OTHER PUBLICATIONS

Milad Hashemi, Learning Memory Access Patterns, Mar. 6, 2018, Available at: https://arxiv.org/abs/1803.02329 (Year: 2018).*
(Continued)

*Primary Examiner* — Ryan Bertram
(74) *Attorney, Agent, or Firm* — Lewis Roca Rothgerber Christie LLP

(57) ABSTRACT

A high bandwidth memory system. In some embodiments, the system includes: a memory stack having a plurality of memory dies and eight 128-bit channels; and a logic die, the memory dies being stacked on, and connected to, the logic die; wherein the logic die may be configured to operate a first channel of the 128-bit channels in: a first mode, in which a first 64 bits operate in pseudo-channel mode, and a second 64 bits operate as two 32-bit fine-grain channels, or a second mode, in which the first 64 bits operate as two 32-bit fine-grain channels, and the second 64 bits operate as two 32-bit fine-grain channels.

20 Claims, 3 Drawing Sheets

Related U.S. Application Data division of application No. 16/439,613, filed on Jun. 12, 2019, now Pat. No. 10,915,451.

(60) Provisional application No. 62/846,406, filed on May 10, 2019.

(56) References Cited

U.S. PATENT DOCUMENTS

| | | |
|---|---|---|
| 9,214,441 B2 | 12/2015 | Kwon et al. |
| 9,274,965 B2 | 3/2016 | El-Mahdy et al. |
| 9,361,973 B2 | 6/2016 | Maheshwari |
| 9,606,916 B2 | 3/2017 | Lee et al. |
| 10,162,522 B1* | 12/2018 | Li .................. G06F 13/1689 |
| 10,180,906 B2 | 1/2019 | Stocksdale et al. |
| 10,817,199 B2 | 10/2020 | Cho |
| 10,831,963 B1* | 11/2020 | Chen .................. G06F 30/39 |
| 2011/0208919 A1 | 8/2011 | Pruthi |
| 2012/0191921 A1 | 7/2012 | Shaeffer et al. |
| 2013/0013866 A1* | 1/2013 | Hsu .................. G06F 11/3471 711/E12.07 |
| 2014/0082322 A1* | 3/2014 | Loh .................. G06F 12/0223 711/E12.001 |
| 2014/0304453 A1 | 10/2014 | Shao et al. |
| 2014/0351546 A1 | 11/2014 | Lichmanov et al. |
| 2015/0006946 A1 | 1/2015 | Littlefield et al. |
| 2015/0026511 A1* | 1/2015 | Loh .................. G06F 11/0727 714/6.12 |
| 2015/0186075 A1* | 7/2015 | Roberts .................. G06F 3/061 710/74 |
| 2017/0147254 A1 | 5/2017 | Adams et al. |
| 2017/0147503 A1* | 5/2017 | de Silva .................. G06F 3/0652 |
| 2018/0024935 A1 | 1/2018 | Meswani et al. |
| 2018/0032437 A1* | 2/2018 | Stocksdale .......... G06F 12/0893 |
| 2018/0074963 A1 | 3/2018 | Mehta et al. |
| 2018/0189227 A1 | 7/2018 | Korthikanti et al. |
| 2018/0358313 A1 | 12/2018 | Newman et al. |
| 2019/0043552 A1* | 2/2019 | Alameer .................. G06F 12/08 |
| 2019/0044515 A1 | 2/2019 | Gutala et al. |
| 2019/0050325 A1 | 2/2019 | Malladi et al. |
| 2020/0257530 A1* | 8/2020 | Lee .................. G11C 7/1084 |
| 2022/0156204 A1 | 5/2022 | Woo et al. |

FOREIGN PATENT DOCUMENTS

| | | |
|---|---|---|
| JP | 2014-2745 A | 1/2014 |
| KR | 10-2015-0019901 A | 2/2015 |
| WO | 2015/006946 A1 | 1/2015 |

OTHER PUBLICATIONS

Amin Amjadi, Online vs. Offline Machine learning: Which one to use?, Jul. 7, 2018, available at: https://blog.goodaudience.com/online-vs-offline-machine-learning-which-one-to-use-934801e0a418 (Year: 2018).*

Bakker, Reinforcement Learning with LSTM in Non-Markovian Tasks with Long-Term Dependencies, Jul. 2001, available at: https://proceedings.neurips.cc/paper_files/paper/2001/file/a38b16173474ba8b1a95bcbc30d3b8a5-Paper.pdf (Year: 2001).*

Nagaraj, High Bandwidth Memory (HBM) Model & Verification IP Implementation—Beginner's guide, Jul. 2018, available at: https://www.design-reuse.com/articles/41407/hbm-model-verification-ip-implementation.pdf (Year: 2018).*

Japanese Office Action dated May 16, 2023, issued in corresponding Japanese Patent Application No. 2020-082694 (8 pages).

Taiwanese Notice of Allowance for TW Patent Application No. 109115399 dated Jul. 28, 2023, 4 pages.

Korean Notice Of Allowance dated Nov. 6, 2024, issued in Korean Patent Application No. 10-2020-0045752 (5 pages).

* cited by examiner

BANDWIDTH BOOSTED STACKED MEMORY

CROSS-REFERENCE TO RELATED APPLICATION(S)

This application is a continuation of U.S. patent application Ser. No. 17/156,362, filed on Jan. 22, 2021, now U.S. Pat. No. 11,513,965, entitled BANDWIDTH BOOSTED STACKED MEMORY, which is a divisional of U.S. patent application Ser. No. 16/439,613, filed Jun. 12, 2019, now U.S. Pat. No. 10,915,451, entitled BANDWIDTH BOOSTED STACKED MEMORY, which claims priority to, and the benefit of, U.S. Provisional Application 62/846,406, filed on May 10, 2019, entitled BANDWIDTH BOOSTED STACKED MEMORY, the entire contents of each of which are incorporated herein by reference.

FIELD

One or more aspects of embodiments according to the present invention relate to high bandwidth memory, and more particularly to a system and method for increasing the bandwidth utilization of high bandwidth memory.

BACKGROUND

High Bandwidth Memory (HBM) is a high-performance (RAM) interface for three-dimensional (3D)-stacked dynamic RAM (DRAM). Emerging applications such as deep neural networks need massive computational and memory abilities to train on different datasets and learn with high accuracy. For such applications, high memory bandwidth becomes critical. Memory bandwidth can be described in terms of core bandwidth and bus bandwidth. As the number of stacked DRAM dies increases while sharing the same bus, bus bandwidth becomes a limiting factor in memory performance.

Thus, there is a need for flexible system architectures and methods of operation that do not require extensive or costly changes to the DRAM core or bus, and that can help to increase the effective memory bandwidth of HBM systems.

SUMMARY

Aspects of embodiments of the present disclosure are directed toward a system and method for a high bandwidth memory (HBM) system that increases the memory bandwidth utilization of the HBM system. This system and method combines a series of modifications to the core HBM chip's peripheral architecture with improvements to the operation of the stacked logic die to boost memory bandwidth utilization. It is intended that these modifications can be implemented individually or in concert to provide increased effective bandwidth for the memory.

In some embodiments of the present invention, the high bandwidth memory system includes: a memory stack having a plurality of memory dies and eight 128-bit channels; and a logic die, the memory dies being stacked on, and connected to, the logic die; wherein the logic die may be configured to operate a first channel of the 128-bit channels in: a first mode, in which a first 64 bits operate in pseudo-channel mode, and a second 64 bits operate as two 32-bit fine-grain channels, or a second mode, in which the first 64 bits operate as two 32-bit fine-grain channels, and the second 64 bits operate as two 32-bit fine-grain channels.

In some embodiments of the present invention, the high bandwidth memory system includes: a memory stack having a plurality of memory dies and eight full-width channels; and a logic die, the memory dies being stacked on, and connected to, the logic die; wherein the logic die is configured to operate a first channel of the full-width channels in: a first mode, in which a first half of the full-width channel operates in pseudo-channel mode, and a second half of the full-width channel operate as two quarter-width fine-grain channels, or a second mode, in which the first half of the full-width channel operates as two quarter-width fine-grain channels, and the second half of the full-width channel operates as two quarter-width fine-grain channels.

According to some embodiments of the present invention, the logic die may be configured to operate the first channel in the first mode, and a second channel of the 128-bit channels in the second mode.

According to some embodiments of the present invention, the logic die is configured to operate the first channel in the first mode, and a second channel of the full-width channels in the second mode.

According to some embodiments of the present invention, the logic die may be capable of changing, at run time, the first channel from operating in the first mode to operating in the second mode.

In some embodiments of the present invention, a mode of the first channel may be configured to be controlled at run time via a mode register of the first channel.

In some embodiments of the present invention, a mode of the first channel may be configured to be controlled at run time via a reserved-for-future-use pin.

According to some embodiments of the present invention, the logic die may be further configured to operate the first channel in the first mode, with a burst length of 2 for the first 64 bits.

According to some embodiments of the present invention, the logic die may be further configured to operate the first channel in the first mode, with a burst length of 2 for the first half of the full-width channel.

According to some additional embodiments of the present invention, the logic die may be further configured to operate the first channel in the second mode, with a burst length of 2 for a first fine-grain channel of the 32-bit fine-grain channels.

According to some additional embodiments of the present invention, the logic die may be further configured to operate the first channel in the second mode, with a burst length of 2 for a first fine-grain channel of the quarter-width fine-grain channels.

According to some embodiments of the present invention, the full-width channels may have a width of 128 bits.

In some embodiments of the present invention, the high bandwidth memory system, includes: a plurality of stacked memory dies, eight channels, and a logic die, the stacked memory dies being stacked on, and connected to, the logic die; each memory die having a plurality of banks each including a plurality of rows and a plurality of columns; a first channel of the eight channels being configured to be operable as any one of: a single 128-bit channel, two 64-bit pseudo channels, a 64-bit pseudo channel and two 32-bit fine-grain channels, or four 32-bit fine-grain channels; wherein the logic die can be configured to return a burst of data following a data access at a row of the rows and a column of the columns within the plurality of banks associated with the first channel, the burst of data having a burst length less than a burst length corresponding to a 256 bit transaction.

In some embodiments of the present invention, the high bandwidth memory system, includes: a plurality of stacked memory dies, eight channels, and a logic die, the stacked memory dies being stacked on, and connected to, the logic die; each memory die having a plurality of banks each including a plurality of rows and a plurality of columns; a first channel of the eight channels being configured to be operable as any one of: a single full-width channel, two half-width pseudo channels, a half-width pseudo channel and two quarter-width fine-grain channels, or four quarter-width fine-grain channels; wherein the logic die can be configured to return a burst of data following a data access at a row of the rows and a column of the columns within the plurality of banks associated with the first channel, the burst of data having a burst length less than a burst length corresponding to a 256 bit transaction.

In some embodiments of the present invention, the logic die may be configured to operate the first channel as two 64-bit pseudo channels with a burst length of less than 4.

In some embodiments of the present invention, the logic die may be configured to operate the first channel as two half-width pseudo channels with a burst length of less than 4.

In some embodiments of the present invention, the logic die is configured to operate the first channel as four 32-bit fine-grain channels with a burst length of 2 or less.

In some embodiments of the present invention, the logic die is configured to operate the first channel as four quarter-width fine-grain channels with a burst length of 2 or less.

In some embodiments of the present invention, the logic die may be configured to use a reserved-for-future-use pin to receive a signal indicating the burst length to be returned.

In some embodiments of the present invention, the logic die may be configured to receive a signal indicating the burst length from a host processor.

According to some embodiments of the present invention, the host processor may be a central processing unit.

According to some additional embodiments of the present invention, the host processor may be a graphics processing unit.

In some embodiments of the present invention, a method for memory addressing in a system having high bandwidth memory and a host processor includes: performing a plurality of memory accesses with a first address mapping function; assessing a first degree of mapped spatial locality with the first address mapping function; assessing a second degree of mapped spatial locality with a second address mapping function; shutting down the system; restarting the system; determining whether the second degree of mapped spatial locality exceeds the first degree of mapped spatial locality; and in response to determining that the second degree of mapped spatial locality exceeds the first degree of mapped spatial locality, performing a plurality of memory accesses with the second address mapping function.

According to some embodiments of the present method, the high bandwidth memory includes a logic die; the performing of a plurality of memory accesses with the first address mapping function includes performing, by the host processor, the plurality of memory accesses with the first address mapping function; and the assessing of the first degree of mapped spatial locality and the assessing of the second degree of mapped spatial locality includes assessing, by the logic die, during an interval of time within which the host processor does not access the high bandwidth memory, the first degree of mapped spatial locality and the second degree of mapped spatial locality.

According to some embodiments of the present method, the second address mapping function may be selected from a plurality of preprogrammed address mapping functions.

According to some embodiments of the present method, the second address mapping function may be communicated by the logic die to the host processor using a reserved-for-future-use pin.

According to some embodiments of the present method, the host processor may be a graphics processing unit.

According to some additional embodiments of the present method, the host processor may be a central processing unit.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a high bandwidth memory system in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

High bandwidth memory (HBM) is a high-performance three dimensional (3D)-stacked dynamic random access memory RAM (DRAM). Second generation High Bandwidth Memory may include up to 12 dies per stack and provide pin transfer rates of 2.4 GT/s (giga transfers per second) or faster. The interface between the stacked dies and a memory-utilizing component, such as a graphics processing unit (GPU) or a central processing unit (CPU), may include 8 channels, each 128 bits wide, for a total of 1024-bit wide access. Second generation High Bandwidth Memory may be able to reach 307 GB/s or higher memory bandwidth per package, and may have a storage capacity of up to, and possibly exceeding, 12 GB per package. The interface of a second generation High Bandwidth Memory system may comply with a standard accepted by the Joint Electron Device Engineering Council (JEDEC) as standard JESD235B.

Figure 1:
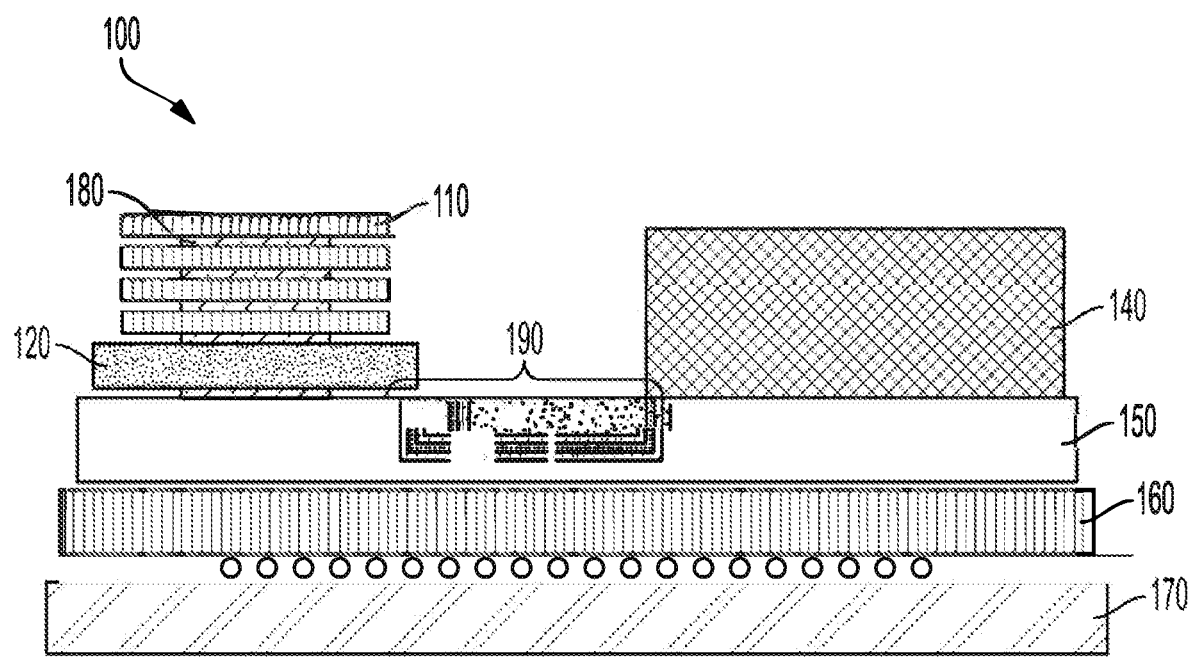
FIG. 1 is a cut-away view of a high bandwidth memory stack in conjunction with a logic processor, silicon (Si) interposer, PCB substrate, and a motherboard, according to an embodiment of the present disclosure.

As shown in FIG. 1, a HBM system 100 may include a plurality of stacked DRAM dies 110 stacked on top of a logic die 120. FIG. 1 depicts a cut-away view of a stack of 4 DRAM dies 110, known as a 4-hi configuration, on top of the logic die 120. As will be known to those skilled in the art, the use of the logic die 120 under the stack may be optional. Other configurations, such as, but not limited to, 2-hi, 8-hi, and 12-hi, may be used within the scope of the present invention. The DRAM dies 110 may be connected by through-silicon-vias (TSVs) 180 and a plurality of microbumps. As depicted in FIG. 1, an interface 190 may connect the HBM stack to a host processor 140. As used herein, the terms "host processor" and "logic processor" may be used interchangeably throughout to denote a memory-utilizing component, such as, but not limited to, a graphics processing unit (GPU), a central processing unit (CPU), or any other memory-utilizing componentry as would be known to those skilled in the art.

Figure 2:
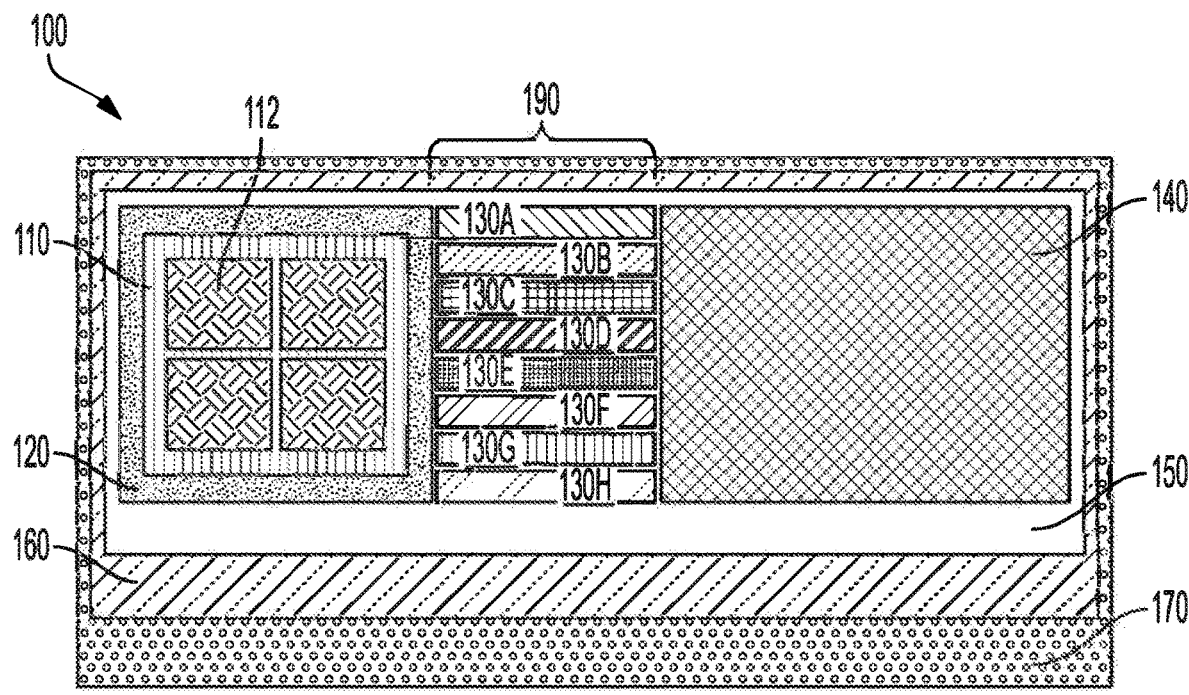
FIG. 2 is a depiction of a high bandwidth memory system including memory channels linking a DRAM stack to a logic processor, according to an embodiment of the present disclosure.

FIG. 2 depicts a top-down view diagram of a HBM stack interfaced with a logic die 120 using an interface 190 including eight 128-bit channels 130. The stack may include DRAM dies 110 each including a plurality memory banks 112 that are associated with the plurality of channels 130. For simplicity, a reduced number of banks 112 per die 110 is illustrated in FIG. 2. The channels 130 may be independent of each other, and each channel 130 may have its own data bus as well as its own command and address bus.

As shown in FIG. 2, the interface 190 between the HBM stack and the host processor 140 may include a plurality of conductive paths (or "traces") creating channels 130A-130H (collectively referred to as channels 130) within a silicon interposer 150. As used herein, a channel operating as a single 128-bit channel will be referred to as a "legacy" channel. As would be known to those skilled in the art, a suitable replacement for the silicon interposer 150 may alternatively be used. The silicon interposer 150 may be coupled to a PCB substrate 160, which may in turn be coupled to another component such as, but not limited to, a motherboard 170.

For higher HBM stacks, for example for 8-hi and 12-hi configurations, the bandwidth utilization of the memory bus may be increasingly important. This is especially true for applications such as deep neural networks and high performance computing (HPC) that require significant amounts of computational power and memory bandwidth. Additional effective bandwidth can be produced currently using HBM stacks that operate in "pseudo channel mode" wherein each channel is operated as 2 semi-independent 64-bit channels. In this mode, a pair of pseudo channels may share a data bus (each using 64 bits of the original 128 bits) and a command and address bus, but be configured to decode and execute commands individually. This increases the number of effective channels and can result in greater bandwidth utilization. However, as demands upon memory bandwidth increase, from things like increasingly powerful GPUs, even pseudo channel mode does not fully take advantage of the bus bandwidth provided by the interface 190 of an HBM system 100.

As a non-limiting example, even in pseudo channel mode, as the number of DRAM dies 110 in a stack increases the number of banks that rely on the data bus associated with that pseudo channel increases. In pseudo channel mode, each bank within the stack is divided into 2 sub-banks. Division of each bank into a pair of sub-banks effectively doubles the number of banks that can be utilized by a channel 130, without requiring a change to the command and address bus, as provided for in the JESD235B standard. Additionally, because the sub-banks can be refreshed in an interleaved sequence, it makes it possible to ensure greater saturation of the data bus which increases bandwidth utilization. Each bank can operate independently with finer granularity of data, enabling better utilization of data bus without data overfetch/wastage.

In a 2-hi configuration, running in pseudo channel mode, only 8 sub-banks share a 64-bit data bus. In such a configuration, each sub-bank uses both TSV arrays in each level of the stack and the bandwidth is limited by factors such as the timing parameters of the DRAM cores. However, in an 8-hi configuration for example, there are 32 sub-banks sharing a 64-bit bus associated with a pseudo channel. By means of non-limiting example, if the core clock speed is 1.2 GHz—corresponding to a data rate of 2.4 Gbps per pin as supported by the JESD235B standard—then there is a 0.83 ns cycle time. When operating in pseudo channel mode, which operates under the standard using a burst length (BL) of 4, each access to a bank or sub-bank thus takes 2 clock cycles as a result of the double data rate operation of the memory. If all 32 sub-banks are perfectly sharing the 64-bit bus, then it takes 32*2=64 clock cycles for a burst access to all 32 sub-banks. 64 clock cycles multiplied by the cycle time gives a burst time of approximately 53 ns. This time is greater than the row cycle time (tRC) for the DRAM memory which may be, as a non-limiting example, approximately 46 ns. Therefore, the data throughput of the memory will be bus limited, and this will become correspondingly worse as HBM stacks increase in height to 12-hi or even 16-hi stacks.

Aspects of embodiments of the present invention are directed to increasing memory bandwidth utilization of a HBM system 100 by introducing additional control over the granularity of data accesses. In some embodiments of the present invention, channel granularity is further refined down to 32 bits. As used herein, a 128-bit channel may be referred to as a "full-width channel", a 64-bit channel may also be referred to as a "half-width channel" or as a "half-width pseudo channel", and a 32-bit wide channel may be referred to as a "fine-grain" channel, or as a "quarter-width fine-grain channel". The refining of the granularity allows for a channel 130 to be operated in the following modes: (i) a first mode in which the channel 130 operates as two half-width pseudo channels (e.g., in which a first half (e.g., a first 64 bits) of the full-width channel operates in pseudo-channel mode, and a second half (e.g., a second 64 bits) of the full-width channel operates in pseudo-channel mode); (ii) a second mode in which the channel 130 operates as four quarter-width fine-grain channels, e.g., in which the first half (e.g., the first 64 bits) of the full-width channel operates as two quarter-width fine-grain channels, and the second half (e.g., the second 64 bits) of the full-width channel operates as two quarter-width fine-grain channels; and (iii) a 128-bit "legacy" mode in which the channel 130 operates as a single channel. It will be understood that in some embodiments, a full-width channel may have a width different from 128 bits and the half-width and quarter-width channels may also, accordingly, have widths different from 64 bits and 32 bits.

This correspondingly increases the number of effective channels. This also creates an additional division of the memory banks, with 1 bank in legacy mode now becoming 4 sub-banks in fine-grain channel mode. The additional division of the sub-banks results in a corresponding increase in the number of sub-banks, each having a new indexing parameter. Indexing of the sub-banks in fine-grain channel mode may, in some embodiments, be accomplished by the use of a pin (which may be a "reserved for future use" (RFU) pin, the BA5 pin (as discussed in further detail below), or a new pin, not part of the present JESD235B standard, added to the package interface). Such embodiments may not require further changes to either the DWORD or AWORD associated with the sub-banks. For example, in pseudo channel mode, bank address (BA) pin 4 is used to index the sub-banks. Likewise an additional pin can be used to index the additional division of the sub-banks into fourths to facilitate use of fine-grain channel mode. In some embodiments, like those in a 4-hi configuration, the BA5 pin may be used (as mentioned above). In stacks higher than 4, where BA5 is used to index the stack ID, another pin may be used as an alternative, with this pin being an RFU pin in some embodiments. The use of an RFU pin may carry the risk that a future update to the JESD235B standard may assign a function to this pin that may not be consistent with its use as an indexing pin for fine-grain channel mode. The use of the BA5 pin may not carry this risk, but the BA5 pin may not be available for use as an indexing pin for fine-grain channel mode in stacks that are larger than 4-hi. The use of a new pin, that is not part of the present JESD235B standard, and that is added to the package interface may have the disadvantage of resulting in a package that is not JESD235B-compliant. Because fine-grain channel mode further divides the original banks into fourths, the number of general input/outputs (GIOs) associated with each fine-grain channel decreases, with the GIO size decreasing from 64 to 32 when moving from pseudo channel mode to fine-grain channel mode.

Furthermore, aspects of the present invention also relate to configurations of the logic die 120 to allow for each of the 8 channels 130 to be operated independently in 128-bit legacy channel mode, 64-bit pseudo channel mode, or 32-bit fine-grain channel mode. This may be accomplished using two mode register bits per channel (each channel may have a set of mode registers controlling its configuration) to specify the channel configuration (with, e.g., a first bit of the two bits specifying whether a first pseudo-channel of the channel is further split into two fine-grain channels, and a second bit specifying whether a second pseudo-channel of the channel is further split into two fine-grain channels). The mode register bits may be existing, unused bits in mode registers defined by the JESD235B standard, or they may be added bits (e.g., bits in a register not defined by the standard). For example, MR9 OP[1:0] may be used, with the following possible values and the corresponding operating modes:

00: x128
01: x64+x64
10: x32+x32+x64
11: x32+x32+x32+x32

In other embodiments, the DEVICE_ID wrapper data register may be augmented, for example, with the following possible values of bits [17:16] and the corresponding operating modes:

10: only x128
01: only x64
00: supports x128+x64, and can be programmable via mode register
11: supports x128+x64+x32, and can be programmed via mode register HBM DRAM, according to the JESD235B standard, defines two modes of operation depending on channel density. The support for the different modes of operation is fixed by design and is indicated on bits [17:16] of the DEVICE_ID wrapper register. To include fine-grain channels, the DEVICE_ID can be augmented in the above mentioned manner, such that the 2 bits can be used to encode x128, x64, x32 modes.

The mode registers may be within the logic die 120 in some embodiments. In some alternative embodiments, the mode registers are within the DRAM dies 110. Smaller channel width operation may, in some cases, provide better bandwidth utilization and data transfer energy efficiency. This is especially true for cases where the data accesses made to the memory have low spatial locality.

Another aspect of embodiments of the present invention is directed towards further refining access granularity by providing a logic die 120 configured to operate the interface channels 130 with a truncated burst length (BL). For example, finer access granularity can be achieved by reducing the burst length for a pseudo channel from 4 to a smaller value, such as BL=2, configured by the logic die 120. Typically, a channel operates with a 32-byte transaction size when in pseudo channel mode. This is achieved with a BL=4 on a 64 bit interface, which could be inefficient for transaction sizes lower than the designated 32-byte fetch. However, when the data being accessed has small granularity and decreased spatial locality, this may be less efficient because it results in time spent prefetching data that will not be utilized for an increasingly large number of accesses.

Therefore, some aspects of embodiments of the present invention are directed to enabling the logic die 120 to program truncated burst lengths to refine the access granularity. By way of non-limiting example, a 64-bit pseudo channel running in a traditional BL=4 mode has an access granularity of 32 bytes (or "32B"). Which is the same as a legacy channel 130 running in BL=2 mode. However, according to aspects of the present invention, a pseudo channel may be run at BL=2 corresponding to a 16B access granularity. Furthermore, where even finer access granularity is more efficient, a fine-grain channel may be operated in, for example, BL=2 resulting in 8B access granularity. Accordingly, the logic die 120 may also be configured to operate a channel 130 with a burst length of 1 (for convenience of terminology, a single data word is referred to herein as a "burst" with a burst length of 1). The channel configuration may, in some embodiments, be based on the types of data being accessed and the spatial locality of the accesses being made to the data stored in the DRAM dies 110. It is understood that these previous examples are provided merely to help illustrate the functioning of the truncated burst aspect of embodiments of the present invention are intended to be non-limiting.

The logic die 120 may, in some embodiments, be configured to provide for reduced burst length operation (i.e., operation with a burst length resulting in a transaction size of less than 256 bits) for each of the legacy channels, pseudo channels, or fine-grain channels independently. Various methods may be used to command the logic die 120 to operate in any such combination of modes. For example, one or more reserved-for-future-use (RFU) pin may be used to convey to the logic die 120 the signal commanding reduced burst lengths (with the number of pins used (each acting as a control bit) depending on the number of modes to be supported, as discussed in further detail below). In other embodiments, the configuration for the burst length may be determined by one or more mode register bits (e.g., unused bits in mode registers defined in the JESD235B standard, or added bits (e.g., bits in added registers, not defined in the JESD235B standard). In some embodiments, the burst length of each legacy channel, pseudo-channel, or fine-grain channel is controlled independently, e.g., to be standard length (BL=8 for a fine-grain channel, BL=4 for a pseudo-channel, and BL=2 for a legacy channel), half-length (e.g, BL=4 for a fine-grain channel), quarter-length, or eighth-length (e.g., BL=1 for a fine-grain channel). In some embodiments non-power-of-2 burst lengths are supported, so that, e.g., a burst length of 5 is possible for a fine-grain channel). A corresponding number of control bits (either pins, or mode register bits) may be used. For example to make it possible to command a channel to operate with four fine-grain channels, each with any of eight possible burst lengths (standard length, 7/8, 3/4, 5/8, half-length, etc.) three bits per fine-grain channel (i.e., 12 control bits per channel) may be used. In some embodiments, a pin of the high bandwidth memory package (e.g., an RFU pin, for each legacy channel, pseudo-channel, or fine-grain channel supporting this feature) may be used to interrupt a partially completed burst. For example, if such a pin is asserted half-way through a standard length burst of a fine-grain channel, only four 32-bit words (instead of eight) may be transferred.

In some embodiments, corresponding changes to the error-correcting code (ECC) that may be employed by the logic die may also be implemented to account for the partial access length while retaining the error detection and correction functionality that is present with the original burst lengths. This could include changes to the ECC algorithm, ECC code word location and pieces of data words over which ECC is computed during data-write.

Figure 3:
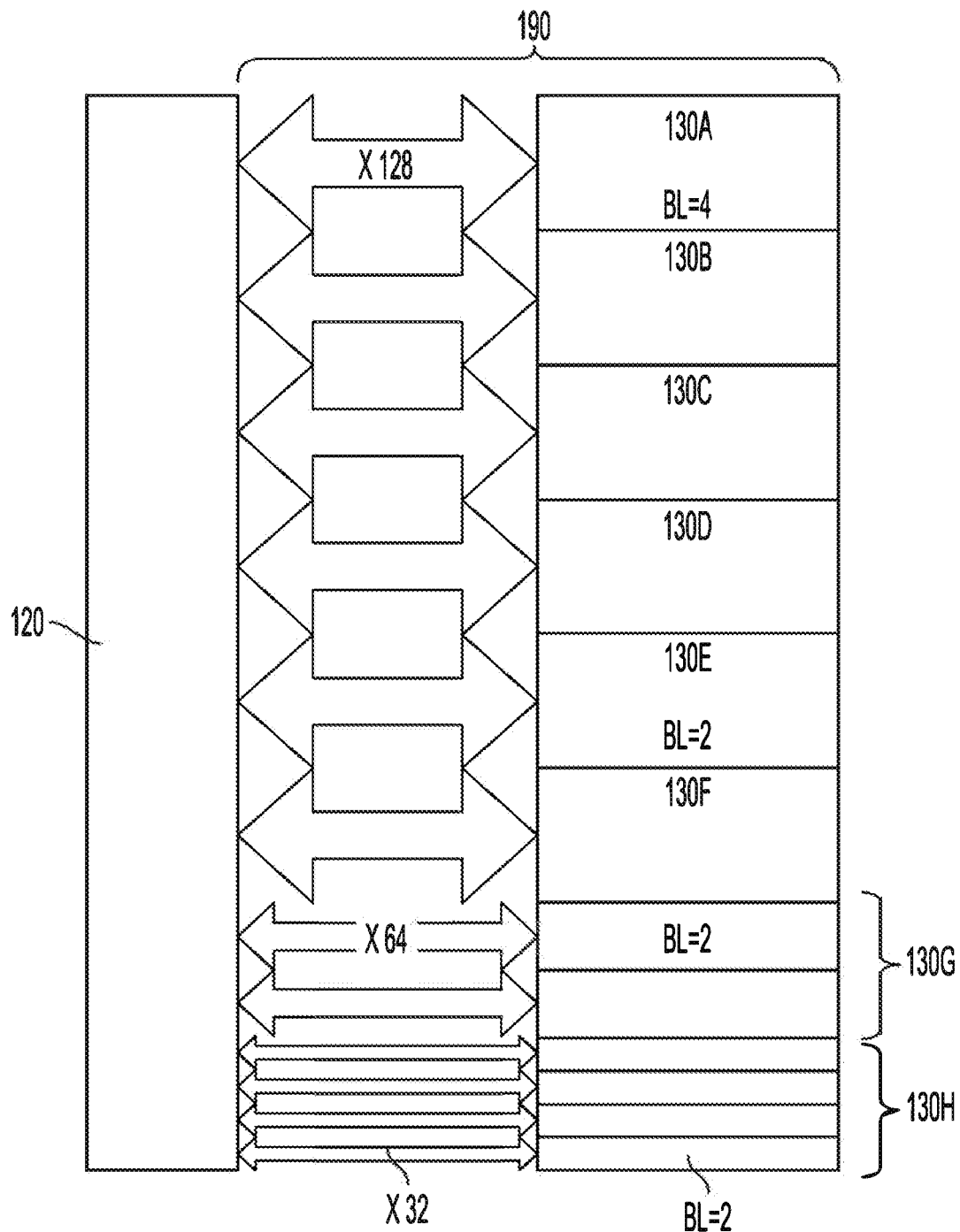
FIG. 3 is a block diagram illustrating how the memory channels can be run independently in different modes, according to an embodiment of the present disclosure.

Aspects of embodiments of the present invention may also be used in concert to provide a greater level of bandwidth control to the logic die. As depicted in FIG. 3, the logic die 120 may operate any of the original 8 128-bit channels 130 in a mode selected independently from that of the other channels 130. This allows for asymmetrical (e.g., non-uniform) data channel width that may provide additional flexibility for increasing bus bandwidth utilization. Furthermore, some embodiments may also incorporate the programmable burst length reduction for each legacy channel, pseudo channel, or fine-grain channel, thereby creating asymmetrical channel width and access granularity.

As depicted in FIG. 3, this asymmetrical channel organization and asymmetrical access granularity allows for different configurations of the channels 130 to be programmed at run time, as defined by the mode registers for each channel 130, that may best utilize the available memory bandwidth for the HBM system. FIG. 3 depicts the logic die 120 operating each of the channels 130 of the interface 190 independently. As shown, there are channels operating in 128-bit legacy mode, 64-bit pseudo mode, and 32-bit fine-grain mode. Additionally, some of the legacy and pseudo channels are depicted as having truncated burst lengths where BL=2.

As a non-limiting example, the present invention may be used in conjunction with a high performance GPU having several thousands of cores running in parallel, producing data accesses that have decreased spatial locality and increased randomness, wherein the logic die 120 may implement an asymmetrical channel configuration and burst length for some of the channels to better utilize the available bandwidth of the interface 190 by increasing the corresponding number of channels and decreasing the data access granularity. This may be the case, for example in the context of machine learning, when there is a need to have fast, lower precision channels using small granularity data while preserving some wider channels for higher precision that use a correspondingly larger access granularity.

Additionally, some aspects of embodiments of the present invention are directed to configuring the logic die 120 to implement a machine-learning algorithm to record and analyze the data accesses made to the memory. The machine-learning algorithm may look for patterns in the memory accesses made by a host processor 140 according to an address mapping function. Using a pre-selected plurality of address mapping functions, the machine-learning algorithm can compare the pattern of memory accesses according to the current address mapping function against predicted memory access patterns according to the plurality of pre-selected address mapping functions to determine if the spatial locality of the accesses could be improved using a different address mapping function. The machine-learning algorithm may then select from the pre-selected plurality of address mapping functions the mapping function that produces the greatest spatial locality for sequential accesses. Because the possible number of address mapping functions is preselected, the machine-learning algorithm can be implemented with reduced complexity. The algorithm compares the spatial locality of sequential accesses of a first address mapping function (which may be referred to as the "degree of mapped spatial locality with the first address mapping function") against the predicted spatial locality generated by a different address mapping function, and selects the address mapping function that produces the greatest spatial locality for sequential accesses. Any suitable machine-learning algorithm, such as reinforcement learning, or such as a long short-term memory recurrent neural network (LSTM), as would be known to those skilled in the art to be effective at predictive modeling for the pattern of accesses may be utilized within the scope of the present invention. During read operation, the neural network continues to be trained in the background. Further, the last layer of the neural network selects the highest ranked address mapping function. So the data saved during this training phase is only a few bits that correspond to that mapping function. The sequence of addresses are not stored at any given point of time, as it impractical to store such large volumes of data, rather, the addresses are continuously fed to the neural network to act as training data. The trained model along with the output bits are used offline by the memory controller in order to make suitable changes when the GPU is reattached/rebooted. This address mapping function selection may increase the number of sequential accesses, and thus correspondingly improve the efficiency of the memory.

The machine-learning algorithm may, in some embodiments, be implemented to study the access patterns while the memory is offline. The logic die 120 may then communicate the ideal mapping function to be used by a host processor 140, such as a CPU or GPU, to improve sequential accesses upon reboot. The logic die 120 may use a RFU pin to convey the preferred mapping function to the host processor 140.

In light of the foregoing, a HBM system 100 implementing aspects of the present invention, whether singularly or in combination, may have a number of advantages over a related art system that lacks the granular channel width and burst size control and intelligent address mapping functions of the present invention. Aspects of embodiments of the present invention may be independently implemented by the logic die 120 which may use a special purpose instruction set architecture to instantiate and execute operations on the new hardware to utilize the benefits of higher bandwidth. Increased effective bandwidth utilization may be achieved without extensive and costly changes to the DRAM cores. Additionally, aspects of embodiments of the present invention may be utilized in concert with other improvements to a HBM system 100 that might improve the timing parameters of the DRAM cores or increase TSV count or bitrate.

In some embodiments of the present invention, a software application programming interface (API) is provided that is configured to allow for access to the logic die 120 and also provides a software driver and library to transparently integrate into existing machine learning frameworks such as TensorFlow, Torch7, Caffe, or any other machine-learning framework as would be known to those skilled in the art.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively. As used herein, the term "or" should be interpreted as "and/or", such that, for example, "A or B" means any one of "A" or "B" or "A and B".

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a high bandwidth memory system architecture have been specifically described and illustrated herein, many modifications and variations will be apparent to those skilled in the art. Accordingly, it is to be understood that a high bandwidth memory system constructed according to principles of this invention may be embodied other than as specifically described herein. The invention is also defined in the following claims, and equivalents thereof.

What is claimed is:

1. A method for memory addressing, the method comprising:
   determining, by a system comprising a memory device coupled to a host processor via a first channel and a second channel, a first spatial proximity of sequential memory accesses with a first function,
   the first channel comprising:
      a first portion having a first width less than a full width of the first channel; and
      a second portion having a second width less than the full width of the first channel, and
   the second channel comprising a third portion having a third width that is different from the first width or the second width,
   wherein a full width of the first channel and a full width of the second channel are operational.

2. The method of claim 1, further comprising:
   performing memory accesses with the first function;
   determining a second spatial proximity of sequential memory accesses with a second function;
   determining that the second spatial proximity of sequential memory accesses corresponds to a greater degree of proximity between memory accesses than the first spatial proximity of sequential memory accesses; and
   performing a memory access with the second function,
   wherein the system comprises logic circuitry configured to:
      perform the memory accesses with the first function; and
      determine the second spatial proximity of sequential memory accesses.

3. The method of claim 2, wherein the second function is selected instead of a third function.

4. The method of claim 2, wherein the second function is communicated by the logic circuitry to the host processor using a pin designated as reserved.

5. The method of claim 2, wherein the host processor comprises a central processing unit or a graphics processing unit.

6. The method of claim 1, further comprising resetting a state of a high bandwidth memory.

7. The method of claim 6, wherein the resetting of the state of the high bandwidth memory comprises modifying power to the system.

8. A method for memory addressing, the method comprising:
implementing, in a system comprising a memory device coupled to a host processor via a first channel and a second channel, a machine-learning algorithm configured to record and process information associated with data accesses,
the first channel comprising:
a first portion having a first width less than a full width of the first channel; and
a second portion having a second width less than the full width of the first channel, and
the second channel comprising a third portion having a third width that is different from the first width or the second width,
wherein a full width of the first channel and a full width of the second channel are operational.

9. The method of claim 8, wherein the first portion is a quarter-width fine-grain channel.

10. The method of claim 8, further comprising processing, by the machine-learning algorithm, the information associated with the data accesses while the memory is offline.

11. The method of claim 8, wherein the machine-learning algorithm is implemented on logic circuitry.

12. The method of claim 8, further comprising:
performing memory accesses with a first function;
determining, by the machine-learning algorithm, a computed pattern of memory accesses;
determining, by the machine-learning algorithm, a first spatial proximity of memory accesses with the first function;
determining, by the machine-learning algorithm, a second spatial proximity of memory accesses for a second function according to the computed pattern of memory accesses;
determining, by the machine-learning algorithm, the second spatial proximity of memory accesses corresponds to a greater degree of proximity between memory accesses than the first spatial proximity of memory accesses; and
performing a memory access with the second function, wherein the second function is selected instead of a third function.

13. The method of claim 12, wherein determining the computed pattern of memory accesses comprises using a reinforcement learning model.

14. The method of claim 12, wherein the machine-learning algorithm comprises a last layer for determining that the second spatial proximity of memory accesses corresponds to a greater degree of proximity between memory accesses than the first spatial proximity of memory accesses.

15. The method of claim 12, wherein:
the determining, by the machine-learning algorithm, of the first spatial proximity of memory accesses with the first function comprises determining a first spatial proximity of sequential memory accesses with the first function; and
the determining, by the machine-learning algorithm, of the second spatial proximity of memory accesses with the second function comprises determining a second spatial proximity of sequential memory accesses with the second function.

16. A computing system comprising:
a memory device coupled to a host processor via a first channel and a second channel,
the first channel comprising:
a first portion having a first width less than a full width of the first channel; and
a second portion having a second width less than the full width of the first channel, and
the second channel comprising a third portion having a third width that is different from the first width or the second width,
wherein a full width of the first channel and a full width of the second channel are operational; and
logic circuitry configured to implement a machine-learning algorithm that processes information associated with memory accesses made to a high bandwidth memory.

17. The computing system of claim 16, wherein the machine-learning algorithm is configured to:
determine a computed pattern of memory accesses;
determining a first spatial proximity of sequential memory accesses with a first function;
determine a second spatial proximity of sequential memory accesses for a second function according to the computed pattern of memory accesses;
determine the second spatial proximity of sequential memory accesses corresponds to a greater degree of proximity between memory accesses than the first spatial proximity of sequential memory accesses; and
communicate instructions to the host processor to perform a memory access with the second function.

18. The computing system of claim 17, wherein the machine-learning algorithm comprises a reinforcement learning model.

19. The computing system of claim 17, wherein the machine-learning algorithm comprises a neural network architecture.

20. The computing system of claim 17, wherein:
the logic circuitry is configured to communicate the instructions to the host processor using a pin designated as reserved; and
the host processor is a central processing unit or a graphics processing unit.

* * * * *